United States Patent Office 3,413,492

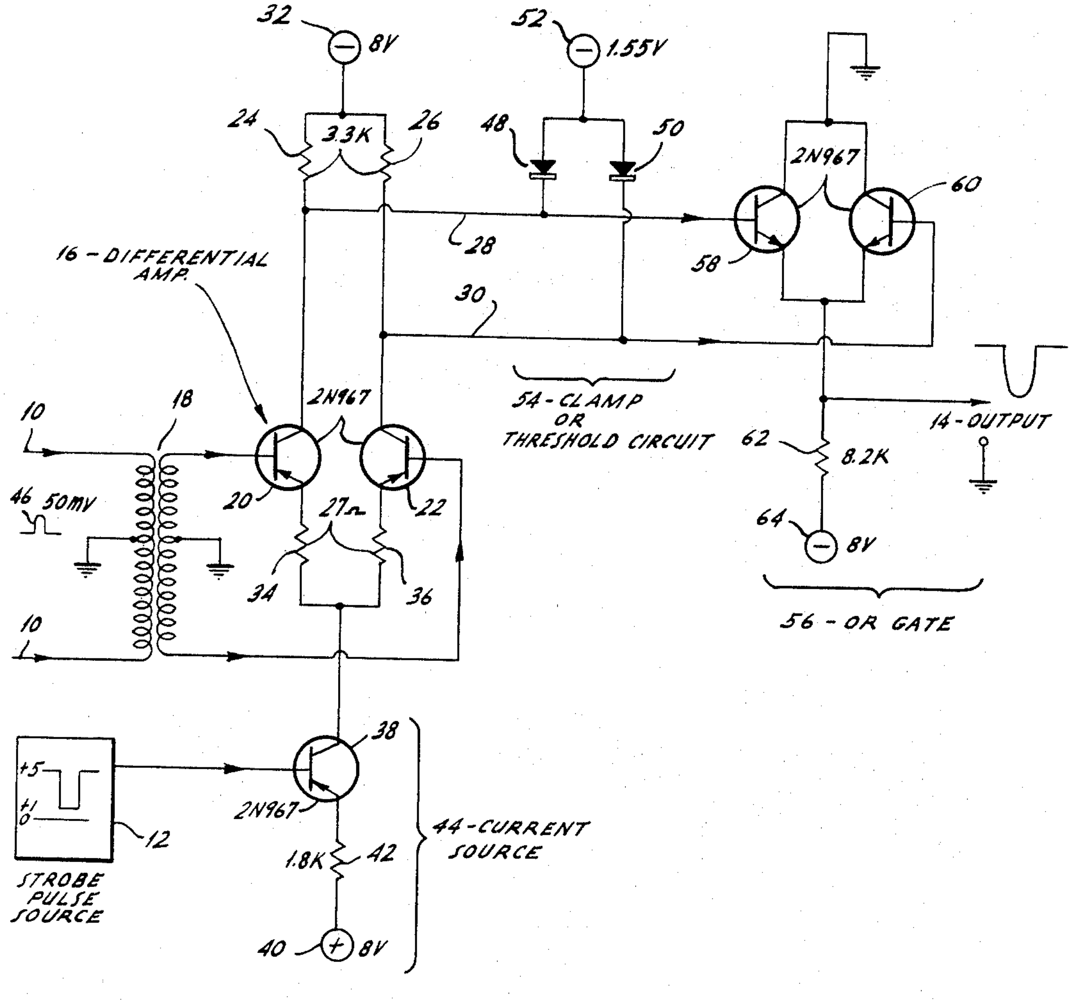
INVENTOR.
ROBERT P. SCHNEIDER
BY
D R Pressman
ATTORNEY

Patented Nov. 26, 1968

3,413,492
STROBE AMPLIFIER OF HIGH SPEED TURN-ON AND TURN-OFF TYPE HAVING INFINITE NOISE REJECTION IN ABSENCE OF STROBE PULSE

Robert P. Schneider, King of Prussia, Pa., assignor to Philco-Ford Corporation, a corporation of Delaware
Filed Oct. 11, 1965, Ser. No. 494,716
5 Claims. (Cl. 307—235)

ABSTRACT OF THE DISCLOSURE

Strobe amplifier comprising two-transistor differential amplifier and two-diode threshold circuit for passing amplifier's output only when variable impedance in series with collector-emitter circuits of transistors assumes low value in response to strobe pulse.

This invention relates to improvements in strobe amplifiers.

Amplifiers are usually used at the respective outputs of the memory section of a digital computer inasmuch as the storage elements used in most memories (e.g., magnetic cores) supply a signal which is too weak for direct utilization by the computer's logic circuitry. Core memories supply also spurious signals to the amplifier which, if amplified, would adversely affect the operation of the computer. Therefore it is usually required that each amplifier be "strobed" or gated into an operative state only when a desired signal appears at its input.

Ideally a strobe amplifier should have an infinite noise rejection capability in absence of an applied strobe pulse and it should be renderable operative instantaneously by a strobe pulse so that the output signal from the memory can be amplified without any amplifier turn-on delay. Heretofore no strobe amplifier had these capabilities. In addition, in most prior art strobe amplifiers a finite delay exists after the strobe pulse is removed before the amplifier returns to an inoperative state. Additional drawbacks of previous strobe amplifiers included complicated circuitry which was costly, unreliable, and difficult to service. Another disadvantage was sensitivity to only one polarity of input signal and inability to amplify or block input signals of the opposite polarity.

*Objects*

Accordingly several objects of the present invention are: (1) the provision of a novel and improved strobe amplifier; (2) the provision of a strobe amplifier with infinite rejecting capabilities in absence of a strobe pulse; (3) the provision of a strobe pulse amplifier which is simple in design and construction and hence reliable, inexpensive, and easy to service; (4) the provision of a strobe amplifier which will amplify input signals of either polarity; and (5) the provision of a strobe amplifier which can be turned on instantly in the presence of a strobe pulse and which can be rendered inoperative instantly upon termination of the strobe pulse.

Other objects and advantages of the present invention will become apparent from a consideration of the ensuing description thereof.

*Summary*

The present strobe amplifier utilizes an amplifying circuit which receives operating current from a current source arranged to supply either low or high values of current as controlled by the strobe pulses. When the low value of current is supplied, the output of the amplifier will be clamped at a fixed level regardless of the magnitude of the input to the amplifier. However, the low value of current will maintain the amplifier conductive so that no delay will be encountered in switching it from an OFF to an ON state when a strobe pulse occurs. In the presence of a strobe pulse the high value of current will be supplied, enabling any input to the amplifier to reverse bias a diode in the clamp circuit, thereby disabling same and allowing a signal output to be supplied by the amplifier.

*Drawing*

A circuit according to one preferred embodiment of the invention is shown in the single figure of drawing.

*Description of circuit*

The circuit of the invention includes signal input terminals 10, a strobe pulse source 12, and an output terminal 14. Signals supplied to input terminals 10 will be amplified by the amplifier and supplied to the output terminal 14 only when strobe pulse source 12 supplies a pulse to the circuit. Strobe pulse source 12 represents any circuitry which is designed to supply a pulse to the circuit whenever a signal to be amplified appears at input terminals 10. In absence of a pulse from source 12, no output will appear at terminal 14 regardless of the magnitude of the input signal supplied to terminals 10, assuming such input signal does not exceed the breakdown potentials of the transistors and other components in the circuit.

Terminals 10 are coupled to a differential amplifier 16 by way of a transformer 18, which has grounded, center-tapped primary and secondary windings. Differential amplifier 16 includes two transistors, 20 and 22, and respective load resistors, 24 and 26. The respective junctions of the load resistors and the collectors form dual output terminals 28 and 30 of the differential amplifier. The other terminals of resistors 24 and 26 are commonly connected to a negative source 32. The end terminals of the secondary winding of transformer 18 are connected to the respective base terminals of transistors 20 and 22. It will be appreciated that by means of this connection, the base terminals are connected through low resistance DC paths to the grounded centertap terminal of the secondary winding of transformer 18. The emitters of transistors 20 and 22 are connected, by means of respective emitter resistors 34 and 36, to the collector of a transistor 38. The emitter of transistor 38 is connected to a positive source 40 via resistor 42. Transistor 38, resistor 42, and source 40 together constitute a current source 44. The output of strobe pulse source 12, which is connected to the base of transistor 38, is arranged to control the current suppliable by source 44 to differential amplifier 16.

In one application of the present invention an input signal was supplied to terminals 10 from a magnetic core coincident current memory which, upon interrogation, would supply, in response to a binary ONE stored in a particular address, a fifty millivolt signal similar to signal 46 shown at input terminals 10. The strobe pulse source 12 is normally arranged to supply a relatively high positive voltage (e.g., 5 volts) to the base of transistor 38. When an output pulse is supplied by source 12, the potential at the output terminal thereof is briefly lowered to about 1 volt, as indicated.

Output terminals 28 and 30 of differential amplifier 16 are connected to the cathodes of respective diodes 48 and 50. The anodes of diodes 48 and 50 are commonly connected to a negative voltage source 52. Elements 48, 50, and 52 together constitute a clamp or threshold circuit 54 which is arranged to maintain the potential of output terminals 28 and 30 at a fixed value equal to the potential of source 52 plus the forward drop of diodes 48 or 50. When the value of current flowing through either of the load resistors 24 and 26 of differential amplifier 16 exceeds a predetermined value, the voltage at terminal 28 or 30 will rise sufficiently to back bias one of diodes 48 or 50, so that its clamping function will no longer exist.

Terminals 28 and 30 are connected to the respective inputs of an OR gate 56. OR gate 56 comprises two transistors 58 and 60, a load resistor 62, and a negative source 64. Source 64 may be the same source as source 32. The collectors of transistors 58 and 60 are commonly connected to a point at ground potential; the emitters thereof are commonly connected to form output terminal 14 which is connected to the junction of load resistor 62 and the emitters. OR gate 56, as will be recognized by those skilled in the art, is a two input, two transistor, emitter follower circuit.

*Operation of circuit*

When not applying a strobe pulse, source 12 will maintain the base of transistor 38 at a relatively high potential, allowing transistor 38 to conduct only slightly, thereby allowing current source 44 to supply what will be referred to hereinafter as a low value of current to the differential amplifier. This low value of current is sufficient to maintain both transistors 20 and 22 of the differential amplifier conductive, i.e., current will be conducted from the emitters to the collectors and through the respective load resistors 24 and 26. However, this current will be insufficient to cause an output signal to be generated by circuit 16. (Transistors 20 and 22 will be conductive since their bases are maintained at ground potential by the centertapped secondary of transformer 18 and the emitters thereof are maintained at a positive potential by the connection to positive source 40 via transistor 38 and resistor 42.) This low value of current will flow through load resistors 24 and 26, creating a voltage on terminals 28 and 30 which will not be sufficient to back bias either diode 48 or diode 50; thus these terminals will be clamped by circuit 54 at about −2 volts. The low value of current supplied by source 44 will be such that even if one of transistors 20 and 22 is fully saturated and the other is completely non-conductive, so that all the current from source 44 flows through one of the load resistors 24 and 26, the drop across this load resistor, when added to the potential of source 32, will be insufficient to back bias the particular diode to which the bottom terminal of said load resistor is connected. Thus when no pulse is supplied by strobe pulse source 12, terminals 28 and 30 will remain at the clamp potential regardless of the magnitude or polarity of the signal supplied to input terminal 10, so long as said input potential does not exceed the breakdown potential of transistors 20 and 22 and the other components in the circuit. Therefore the circuit has a substantially infinite noise rejection capability in its "OFF" state.

Next assume that strobe pulse source 12 supplies a pulse to transistor 38. Transistor 38 will be driven into a greater level of conduction so that current source 44 will be capable of providing a high value of current to the differential amplifier. This high value of current is such that in absence of an input to terminal 10, the current flowing through resistors 24 and 26 will create voltages on terminals 28 and 30 almost sufficient to reverse bias diodes 48 and 50.

It will be apparent that if an input signal is supplied to terminals 18 under these conditions it will be applied in push pull fashion to the bases of transistors 22 and 20 so as to cause one of transistors 22 and 20 to conduct more strongly and the other to conduct less strongly, according to conventional differential amplifier action. Thus the current through one of load impedances 24 and 26 will increase and the current through the other will decrease. Accordingly the potential at one of terminals 28 and 30 will rise sufficiently to back bias one of the diodes 48 and 50. This will effectively unclamp said output terminal and remove this diode from the circuit. The output signal from amplifier 12 will be supplied to the emitter follower OR gate 56 which will cause it to appear in current-amplified form at output terminal 14. It will be appreciated that the differential amplifier circuit will amplify either polarity of input signal supplied thereto.

The circuit was built and operated successfully using the components having the values indicated in the drawing. It will be appreciated that the circuit is easily constructable in integrated circuit form, i.e., all of the components shown in the drawing can be formed without difficulty within a silicon monolithic microcircuit. The circuit may be used as a gated or strobe amplifier for any input signal whatsoever; the particular form of input signal shown at 46 is merely illustrative of one type of signal which is supplied by a memory core matrix. Similarly, strobe pulse source 12 does not have to have the pulse waveform shown but may represent any source of two discrete potentials, each of indefinite duration. For example, source 12 may comprise two voltage sources and a manual single-pole double-throw switch for connecting the sources selectively to the base of transistor 38.

While a differential amplifier with a dual diode clamping circuit is preferred in order that the circuit will have greater gain and be sensitive to bipolar inputs, it will be understood that a single transistor amplifier with a single clamping diode circuit can be used alternatively. In this case no OR gate 56 need be used. Alternatively, two such amplifiers energized in opposite phase by an input signal may supply the two inputs to OR gate 56. Further, a more complicated amplifier and clamping circuit than shown may be used. The parameters of the circuit however, must be adjusted so that no output will be provided by the amplifier when the current source supplies a low value of current, and so that the clamp or threshold circuit is biased close to its threshold value when the current source is arranged to supply a high value of current.

It will be appreciated that an advantageous feature of the invention is that the amplifier is always maintained conductive by the low value of current supplied by the current source, thus eliminating the delay normally encountered in switching a transistor from a non-conductive state to a conductive state.

While there has been described what is at present considered to be the preferred embodiment of the invention it will be apparent that various modifications and other embodiments thereof will occur to those skilled in the art within the scope of the invention. Accordingly, it is desired that the scope of the invention be limited by the appended claims only.

I claim:

1. A strobe amplifier, comprising in combination:

(a) a transistor having a base electrode and two additional electrodes comprising an emitter and a collector, (b) a load impedance and a direct bias source, said load impedance being connected between one of said additional electrodes and one terminal of said direct bias source, (c) first means for quiescently forward biasing the base-emitter junction of said transistor and for supplying an input signal to be amplified to said transistor, the polarity of the signal to be amplified being such as to increase the forward bias of the base-emitter junction of said transistor in proportion to the amplitude of said input signal, (d) second means comprising a controllable strobe pulse source and variable impedance means responsive to the output of said source and connected between a second terminal of said bias source and the other of said additional electrodes for alternatively (1) providing a relatively high impedance between said second terminal of said bias source and said other of said additional electrodes of said transistor in absence of an output pulse from said strobe pulse source, so that a relatively low quiescent current will flow through said variable impedance means and the collector-emitter circuit of said transistor, and (2) providing a relatively low impedance between said second terminal of said bias source and said other of said additional electrodes of said transistor in response to an output pulse from said strobe pulse source, such that a relatively high current will flow in the collector-emitter circuit of said transistor when the forward bias of the base-emitter junction of said transistor is increased by said input signal, and (e) a clamp circuit comprising a diode connected between one of said additional electrodes of said transistor and a point whose potential is such that said diode will be forward biased to clamp said electrode at the potential of said point whether said strobe pulse is present or absent, and will be reverse-biased to isolate said electrode from said point only when said strobe pulse is supplied and the forward bias of the base-emitter junction of said transistor is increased by said input signal.

2. The amplifier of claim 1 wherein said variable impedance means comprises a transistor whose base is connected to said strobe pulse source and whose collector-emitter circuit is conected between said second terminal of said bias source and said other of said additional electrodes of said transistor.

3. The amplifier of claim 1 wherein said input signal can have either polarity and further including:

(a) a second transistor having a base electrode and two additional electrodes comprising an emitter and a collector, (b) said first means also being arranged to quiescently forward bias the base-emitter junction of said second transistor and supply said input signal to vary the base electrode voltage of said second transistor in a direction opposite to that which said input signal varies the base electrode voltage of said first-named transistor, (c) a second load impedance connected between one of said additional electrodes of said second transistor and said one terminal of said direct bias source, the other of said additional electrodes of said transistor being connected to said second terminal of said bias source via said variable impedance means, (d) a second clamp circuit comprising a second diode conected between one of said additional electrodes of said second transistor and a point whose potential is such that said diode will be forward biased to clamp said electrode at the potential of said point whether said strobe pulse is present or absent, and will be reverse-biased to isolate said electrode from said point only when said strobe pulse is supplied and the forward bias of the base-emitter junction of said second transistor is increased by said input signal, and (e) an OR gate having two inputs connected to the respective ones of said additional electrodes of said two transistors.

4. A strobe amplifier, comprising in combination:

(a) first and second transistors, each having a base electrode, an emitter electrode, and a collector electrode, (b) a pair of load impedances and a direct bias source, each of said impedances being conected between a collector electrode of one of said transistors and one terminal of said direct bias source, (c) means for quiescently forward biasing the base-emitter junction of each of said transistors and for supplying an input signal to be amplified to said two transistors in opposite phase so as to increase the forward bias of the base-emitter junction of one of said transistors and decrease the forward bias of the base-emitter junction of the other of said transistors, (d) a controllable strobe pulse source and variable impedance means responsive to the output of said strobe pulse source for alternatively (1) providing a relatively high impedance between another terminal of said bias source and the emitter electrodes of said transistors in absence of an output pulse from said strobe pulse source, such that a relatively low quiescent current will flow through said variable impedance means and the collector-emitter circuit of each of said transistors, and (2) providing a relatively low impedance between said other terminal of said bias source and the emitter electrodes of said transistors in response to an output pulse from said strobe pulse source, such that a relatively high current will flow through said variable impedance means and the collector-emitter circuit of one of said transistors when the forward bias of the base-emitter junction thereof is increased by said input signal, (e) a clamp circuit comprising a pair of diodes, each being connected between the collector electrode of one of said transistors and a point whose potential is such that (1) each of said diodes will be forward biased to clamp its respective collector electrode to the potential of said point whether said strobe pulse is present or absent, and (2) one of said diodes will be reverse biased to isolate its respective collector electrode from said point whenever said strobe pulse is present and the forward bias of the base-emitter junction of one of said transistors is increased by said input signal.

5. The amplifier of claim 4 wherein said (c) means comprises a transformer having a secondary winding with end terminals connected to the base electrodes of said first and second transistors, respectively, and a center tap terterminal thereof connected to a fixed potential point.

References Cited

UNITED STATES PATENTS

| | | | |
|---|---|---|---|
| 3,219,839 | 11/1965 | Fletcher | 307—88.5 |
| 3,315,089 | 4/1967 | Mayne | 307—88.5 |
| 3,316,422 | 4/1967 | Rogge | 307—88.5 |

ARTHUR GAUSS, *Primary Examiner.*

S. D. MILLER, *Assistant Examiner.*